United States Patent [19]
Barada et al.

[11] Patent Number: 5,346,601
[45] Date of Patent: Sep. 13, 1994

[54] SPUTTER COATING COLLIMATOR WITH INTEGRAL REACTIVE GAS DISTRIBUTION

[76] Inventors: Andrew Barada, 41 Sunrise Ave., New Canaan, Conn. 06840; Steven D. Hurwitt, 159 Pascak Rd., Park Ridge, N.J. 07656

[21] Appl. No.: 60,315

[22] Filed: May 11, 1993

[51] Int. Cl.⁵ ............................................. C23C 14/34
[52] U.S. Cl. ........................ 204/192.15; 204/192.12; 204/192.17; 204/298.07; 204/298.11
[58] Field of Search .............. 204/192.12, 192.15, 204/192.17, 298.07, 298.11

[56] References Cited

U.S. PATENT DOCUMENTS

| | | | |
|---|---|---|---|
| 3,595,773 | 7/1971 | Wurm | 204/192.12 |
| 4,297,162 | 10/1981 | Mundt et al. | 156/643 |
| 4,491,496 | 1/1985 | Laporte et al. | 156/345 |
| 4,572,842 | 2/1986 | Dietrich et al. | 427/571 |
| 4,738,748 | 4/1988 | Kisa | 156/643 |
| 4,780,169 | 10/1988 | Stark et al. | 156/345 |
| 4,793,975 | 12/1988 | Drage | 422/186.05 |
| 4,826,585 | 5/1989 | Davis | 204/298.37 |
| 4,846,928 | 7/1989 | Dolins et al. | 156/626 |
| 4,886,565 | 12/1989 | Koshiba et al. | 156/345 |
| 4,943,361 | 7/1990 | Kakehi et al. | 204/192.32 |
| 4,957,588 | 9/1990 | Koshiba et al. | 156/628 |
| 5,006,220 | 4/1991 | Hijikata et al. | 204/298.33 |
| 5,009,738 | 4/1991 | Gruenwald et al. | 156/345 |
| 5,037,262 | 8/1991 | Moll et al. | 414/222 |
| 5,108,569 | 5/1992 | Gilboa et al. | 204/192.13 |
| 5,108,571 | 4/1992 | Ludwig et al. | 204/192.13 |
| 5,169,509 | 12/1992 | Latz et al. | 204/298.03 |
| 5,223,108 | 6/1993 | Hurwitt | 204/192.12 |

FOREIGN PATENT DOCUMENTS

| | | | |
|---|---|---|---|
| 0165400 | 12/1985 | European Pat. Off. | 204/298.33 |
| 61-75514 | 4/1986 | Japan | 204/298.11 |
| 62-7855 | 1/1987 | Japan | 204/298.11 |
| 63-310965 | 12/1988 | Japan | 204/298.11 |
| 4-65823 | 3/1992 | Japan | 204/298.07 |

*Primary Examiner*—Aaron Weisstuch
*Attorney, Agent, or Firm*—Wood, Herron & Evans

[57] ABSTRACT

A sputter coating apparatus particularly useful for applying sputtered films, particularly reactively produced sputtered films such as titanium nitride, onto semiconductor wafers, is provided with a collimator that includes a grid of vanes for restricting the paths available for the sputtered material to take from the target toward the wafer. A flow of fresh reactive gas is maintained on the surface of the wafer by gas outlets carried by vanes of the collimator. The outlets are supplied with the gas through passages provided in the vanes, so that the gas supply does not contribute to the shadowing of the sputtered material from the wafer except in accordance with the intended shadowing for which the collimator is provided.

14 Claims, 1 Drawing Sheet

U.S. Patent    Sep. 13, 1994    5,346,601
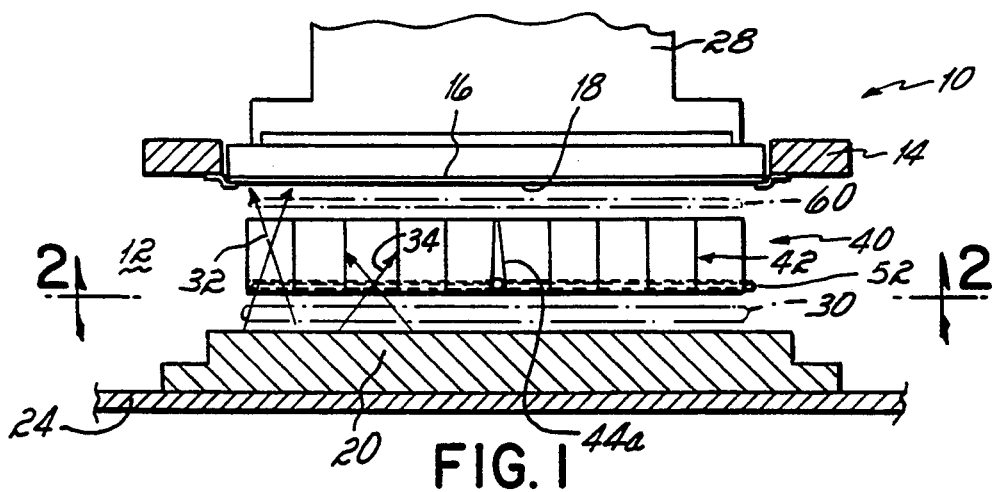
FIG. 1
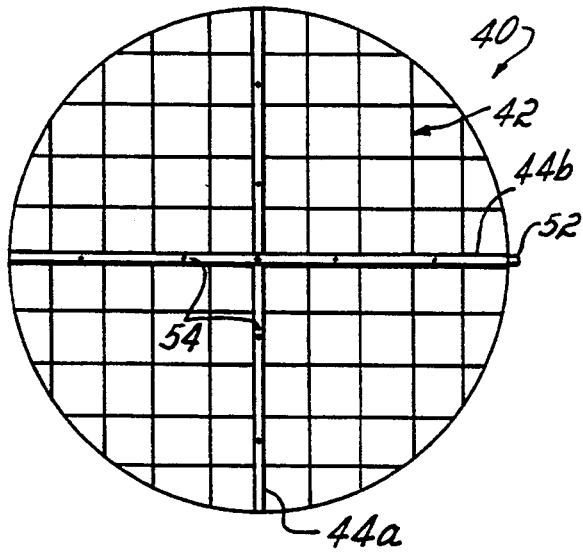
FIG. 2
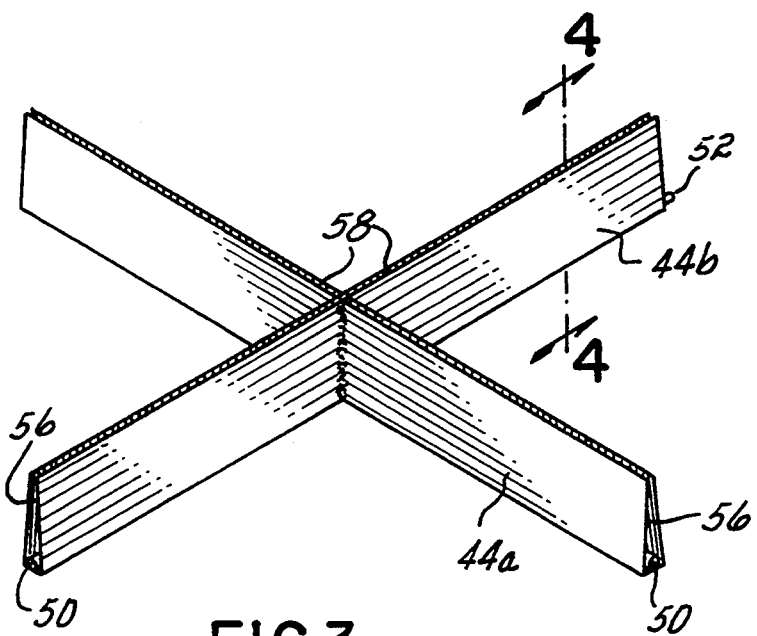
FIG. 3
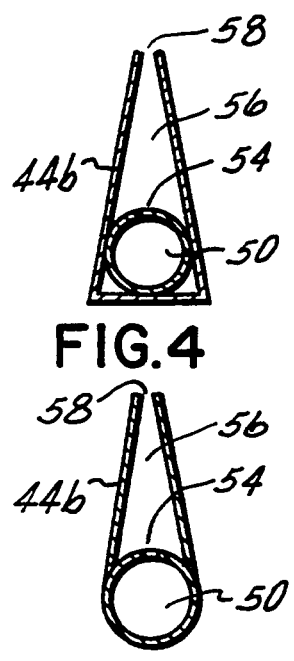
FIG. 4
FIG. 5

SPUTTER COATING COLLIMATOR WITH INTEGRAL REACTIVE GAS DISTRIBUTION

The present invention relates to sputter deposition, and is especially advantageous when applied to reactive sputter deposition of films, such as titanium nitride, onto substrates such as semiconductor wafers. More particularly, the present invention relates to the sputter deposition of films, such as titanium nitride films reactively formed by combining titanium sputtered from titanium targets with nitrogen gas, on the surfaces of semiconductor wafers having stepped or other three dimensional features.

BACKGROUND OF THE INVENTION

In many sputter deposition processes, particularly reactive processes such as those used to deposit materials such as titanium nitride onto stepped and other three dimensional features of semiconductor wafers, it is necessary to provide a controlled flow of gas along the surface of the wafer to be coated. This flow of gas is necessary, particularly in reactive deposition processes, to bring an adequate supply of fresh gas into contact with the wafer and to flush away spent gas from the wafer surface that might interfere with the reactive process that forms the coating.

For example, in the deposition of titanium nitride sputtered films, titanium metal is sputtered from a metallic titanium target onto the surface of a substrate to be coated. At the surface, which is maintained at a controlled reaction temperature of from about 200° C. to about 450° C., nitrogen gas is brought into contact with the titanium to form the film of titanium nitride.

In sputter deposition processes, a plasma is created, usually in an inert gas such as argon, adjacent a target formed of the material that is to become at least a part of the coating. By developing an electric potential between the plasma and the target, ions are produced in the inert gas that physically bombard the target and dislodge the sputtering material, causing the sputtered material to propagate to the surface of a substrate to be coated.

In titanium nitride deposition, such targets are typically of titanium metal and are bombarded with inert argon ions. Nitrogen gas, which is essential in such a process at the surface of the substrate, is an undesirable element at the surface of the target where it may react to form titanium nitride that inhibits the sputtering of titanium metal, slowing the sputter deposition process. Generally, in reactive sputter deposition processes, the target is bombarded with ions from an inert gas, and the dislodged particles brought into contact with the substrate in the presence of a reactive gas, which brings about a reaction that produces the final coating or causes it to bond to the surface. Usually, such a reactive gas produces undesirable results whenever brought into contact with the surface of the target.

In sputter coating processes, particularly for coating stepped semiconductor wafers, it is desirable to control the directionality of the propagating sputtered particles onto the substrate. One such way for controlling the flux onto the substrate is to interpose a collimator between the substrate and the target. Such a collimator is provided with a grid or other such structure having openings therethrough that permit the passage of particles in certain directions and shadow particles passing in other directions. As a result, coatings can be formed through a collimator at the bottoms of vias of improved thickness relative to the sides. Such collimators aid in the distribution of the coating onto three dimensional features of the substrate surface, and may also be used to control the uniformity of the produced film on the substrate surfaces.

In sputter coating processes, it is desirable to bring gasses into contact with the surface of the substrate by directly communicating the gas onto the substrate. The problem this presents is that the means for delivering the gasses to the areas where they are needed on the substrate may shadow the surface of the substrate and interfere with the distribution of sputtered film onto the substrate from the target.

Thus, there is a need for delivering reactive or other sputtering gas onto a substrate surface without undesirably shadowing the surface to be coated from the sputtered material.

SUMMARY OF THE INVENTION

A primary objective of the present invention is to provide a method and apparatus by which gasses, particularly reactive gasses, can be brought into contact with the surface of a substrate being coated in a sputter deposition process, and to do so with a desired uniformity.

It is a more particular objective of the present invention to bring reactive gasses into contact with the surface of the substrate without interfering with the propagation of sputtered material from the target onto the substrate.

It is still another objective of the present invention to provide for the communication of reactive gas onto the surface of a substrate being coated without contacting the surface of the target with reactive gas.

In accordance with the principles of the present invention, there is provided a sputtering apparatus in which a collimator is disposed between the target and the substrate to be coated. One such collimator and its use are particularly described in U.S. Pat. No. 5,223,108, expressly incorporated herein by reference. In the apparatus of the preferred embodiment of the invention, a plasma is formed on the target side of the collimator to produce ions to bombard the surface of the target.

The collimator in the preferred embodiment of the invention is formed having a grid of vanes defining spaces between the vanes to allow the material sputtered from the target to reach the substrate along controlled paths, usually straight lines from the portion of the target from which the sputtered particles originate and a portion of the substrate surface on which the coating is to be formed.

In accordance with the principles of the invention, passages or tubes are provided on the surface of or within the collimator to communicate gas, such as reactant gas, onto the surface of the substrate, particularly near the center of the substrate where reactive gas tends to be consumed and need replenishment and where reactive byproducts tend to form, interfere with the coating process, and need to be flushed away.

In a typical collimator, the vanes or other form of web structure has a pattern of holes therethrough that have a diameter or cross-sectional dimension to which the thickness of the web structure bears a relationship referred to as the aspect ratio. The web structure of the collimator shadows some of the sputtered material that would impinge upon the substrate at undesirable angles, such as shallow angles that would result in the coatings of the sides of vias. This has the side effect, usually undesirable, of slowing down the deposition reaction and reducing the throughput of the apparatus. Accordingly, collimators will usually be designed to attenuate the flux of sputtered material as little as possible, with the hole pattern occupying as much of the area as possible. The web structure of the collimator and hole pattern therein, when properly designed and when the collimator is properly spaced between the substrate and the target of a sputtering apparatus, will not cause undesirable shadowing of the substrate.

Therefore, in accordance with the principles of the present invention, the passages provided in the collimator for communicating the gas to the surface of the substrate are, in the preferred embodiments, either contained within the web structure of the collimator or attached to the surfaces of the web structure or vanes. Where passages are contained within the vanes, they are dimensioned so that the design of the collimator, which provides the proper collimating effect on the sputtered target material and avoids undesirable shadowing of the substrate, does not occur. Where passages are provided on the surfaces of the vanes, they are positioned so as to also avoid any shadowing of the sputtered particles in a way that is not part of the collimator design.

In the preferred embodiment of the invention, a pair of vanes of the plurality cross at a right angle at the center of the substrate. These crossing vanes contain passages for the reactant gas. In each of the crossing vanes, a series of outlets is formed in the vanes on the substrate side thereof to direct the gas onto the surface of the substrate, particularly near the center of the substrate from where they will tend to flow radially outwardly across the substrate surface to the generally circular substrate rim. The outlets may be distributed along the vanes and may be of varying sizes so that they will provide a desired gas distribution onto the substrate surface.

In one illustrated embodiment, the vanes of the collimator are designed to provide the appropriate collimating effect, and then formed by folding the material of which the grid is made over distribution tubes, with the sides of the grid vanes tapered at a critical design angle. The vanes so formed are made to be open along the edges thereof facing the substrate. The grid vane material is tack welded to the gas distribution tubes. Alternatively, the tapered vanes are e-beam welded on each side of the tubes to form a gas tight seal. The gas is supplied to the tubes and flows out through holes along the tubes into the interior of the vanes and out a slit along the open side thereof and onto the substrate. In such preferred embodiments, the holes in the passages provide the primary restriction to the flow of gas into the processing chamber. These holes are generally small and few in number and susceptible to clogging by back sputtered material. Accordingly, the web structure of the preferred embodiments surrounds the passages and generally protects the passage holes from the back sputtered material.

With the present invention, a fresh uniform flow of gas is provided on the surface of the substrate being coated, without shadowing the substrate from the flux of sputter coating material, and without exposing the surface of the target to the gas.

These and other objectives and advantages of the present invention will be apparent from the following detailed description of the drawings in which:

BRIEF DESCRIPTION OF THE DRAWINGS

FIG. 1 is a schematic cross sectional drawing of a sputter coating apparatus according to principles of the present invention.

FIG. 2 is a schematic bottom view along line 2—2 of FIG. 1 illustrating a collimator portion of the apparatus.

FIG. 3 is a perspective view of a pair of vanes of the collimators of FIG. 2 provided with gas passages according to one embodiment of the present invention.

FIGS. 4 and 5 are cross sectional views along the line 4—4 of FIG. 3 illustrating two alternative versions of the vane of FIG. 3.

DETAILED DESCRIPTION OF THE DRAWINGS

Referring to FIG. 1, a processing chamber 12 of a sputter deposition apparatus 10 is illustrated. The apparatus includes a wafer holder 14 for supporting a semiconductor wafer substrate 16 for processing. The wafer or substrate 16, as illustrated, is supported with one side 18 thereof disposed toward the chamber 12 to receive a sputtered film of coating material from a target 20 fixed in the chamber 12 with respect to chamber wall 24.

The target 20 is preferably a circular target and may be magnetron enhanced by a magnet (not shown) usually positioned behind the target 20. Behind the wafer 16 there is frequently provided a backplane heater 28 to heat the wafer 16. Where the film being deposited is titanium nitride, for example, the wafer 16 will be heated to several hundred degrees celsius.

In typical sputter deposition onto the wafer 16, the target, which is a cathode, is negatively charged with respect to the grounded structure of the chamber 12. This causes electrons to be emitted from the cathode surface into a sparse gas maintained in the vacuum chamber 12. The electrons ionize the gas and form a plasma 30 in the region adjacent the surface of the target 20. Positive ions from the plasma 30 are then attracted to the surface of the negatively charged target 20 and dislodge particles of the material of which the target is made. These particles propagate in the directions of the arrows 32 and strike and attach themselves to the substrate surface 18, thereby forming a film.

In the deposition of films of titanium nitride, for example, and with some other films, part of the process of forming the film involves the reacting of the sputtered particles at the surface 18 of the wafer 16 with a reactive gas. This involves the introduction of the reactive gas into the volume of the chamber 12. Unless, however, the reactive gas is caused to flow uniformly over the surface 18 of the substrate 16 so as to bring fresh reactant gas into contact with the surface 18 and to flush away spent reactive byproducts, uniform deposition of the film will not occur.

In some sputter deposition processes, and those employed with the present invention, a collimator 40 is disposed between the plasma 30 and the substrate 16. The collimator 40 includes a grid 42 of vanes 44a and 44b. In the embodiments illustrated, as shown in FIGS. 2 and 3, the vanes 44 include a pair of mutually perpendicular diametric vanes 44a and 44b that intersect at the center of the collimator 40. Each of the vanes 44 has a width extending in a direction between the target 20 and substrate 16. These vanes allow particles to propagate along the paths defined by the arrows 32 but prevent particles from propagating at greater angles as represented by the arrows 34.

In accordance with the present invention, the central vanes 44a and 44b, as illustrated in FIGS. 3-5, each have a hollow passage 50 therein having a gas inlet 52 at one end thereof and a plurality of gas outlets 54 spaced along the passage 50. With two perpendicular vanes such as the vanes 44a and 44b, the outlets are preferably 5 to 16 in number, ranging from a pattern, either with or without a single hole in the center of the collimator on an axis through the center of the substrate, with, for example, multiples of four holes spaced symmetrically around the axis.

In a sputtering application where the chamber pressures are in the range of from 0.5 to 10 Torr, a flow of gas into the chamber, either as a pure reactant gas or as a mixture of reactant and inert gas, may be in the range of from 5 to 200 sccm. The preferred combined cross sectional areas of the outlets 54 in such applications are in the range of from 5 to 20 square millimeters. The precise area selected is preferably small, but not resulting in holes so small that they are prone to clogging.

In the embodiments shown, the outlets from the passage 50 communicate with the interior 56 of the vanes 44a and 44b, which are further provided with outlets in the form of a precision gap or slit 58 in the edge of the vanes 44a and 44b nearest the substrate 16. The slit is, with hole dimensions stated above, preferably in the range of approximately 0.3 to 1 millimeter wide, with the holes 54 spaced far enough from the slit 58 to that they are protected from back sputtered material, and so that the gas from the openings 54 is distributed in the interior 56 before leaving the slit 58.

The passages 50 of the vanes 44a and 44b are interconnected at the intersection of the vanes 44a and 44b by a four way cross fitting (not shown).

In operation, inert gas is provided in the chamber 12 and evacuated down to some operating vacuum pressure level appropriate for the process being carried out. The plasma is formed in this gas adjacent the target 20, which produces the ions that bombard the target 20 and dislodge particles that propagate along arrows 32 through openings in the grid 42 of the collimator onto the surface 18 of the substrate. On the substrate side of the collimator 40, reactant gas, supplied to the passages 50 through the inlet 52, is emitted from the outlets 54 and 58 onto the surface 18 of the wafer 16, where it reacts to enhance the formation of the film. On this side of the collimator 40, a secondary plasma 60 may be produced by biasing the wafer 16. This plasma may involve, in part, the reactant gas, but will be separated from the primary plasma 30.

With the invention, the reactant gas is caused to flow effectively across the wafer surface 18, while the structure for distributing the reactant gas is contained within, or shielded by the collimator 40 in such a way that the distribution structure does not itself contribute to a shadowing of the substrate 16 from the sputtered material from the target.

Only certain embodiments of the invention have been herein described, but those skilled in the art will appreciate that various additions, alternatives or modifications to that described may be employed without departing from the principles of the present invention.

Accordingly, what is claimed is:

1. A reactive sputter deposition apparatus comprising:

a vacuum sputter coating chamber;
means for filling the chamber with a sputtering gas at a vacuum pressure level;
means for holding a substrate in the chamber;
means for supporting a sputtering target in the vacuum chamber with a sputtering surface thereof facing a substrate held on the holding means;
means for producing a plasma of the sputtering gas in the space between the target and the substrate and for energizing ions in the plasma to bombard the target to dislodge coating material therefrom for propagation onto the substrate;
a collimator interposed between the plasma space and the substrate in the chamber, the collimator including a web structure physically occupying space between the target and the substrate, the web structure having openings therethrough and being dimensioned to restrict propagation paths of material sputtered from the target through the openings and onto the substrate;
gas distribution passages carried by the collimator in the space physically occupied by the web structure or otherwise out of the propagation paths of the sputtered material, the passages including outlets distributed across the collimator for discharging gas from the passages toward the substrate; and
means for supplying a reactive gas to the passages from which the reactive gas is distributed through the outlets and over the surface of the substrate.

2. The apparatus of claim 1 wherein:
the passages are formed within the web structure of the collimator.

3. The apparatus of claim 1 wherein:
the outlets are positioned and sized so as to affect the distribution of supplied processing gas over the surface of the substrate.

4. The apparatus of claim 3 wherein:
the substrate holding means and target supporting means are circular and aligned on a centerline thereof;
the web structure of the collimator includes at least one central vane extending approximately diametrically through a centerline; and
the outlets include outlets distributed along the central vane near the centerline of the substrate holding means.

5. The apparatus of claim 4 wherein:
the web structure of the collimator includes two central mutually perpendicular vanes extending approximately diametrically through the centerline; and
the outlets include outlets are distributed along the central vanes near the centerline of the substrate holding means.

6. A sputtering apparatus comprising:
a vacuum sputter coating chamber;
means for holding a substrate in the chamber;
means for supporting a sputtering target in the vacuum chamber with a sputtering surface thereof facing a substrate held on the holding means;
means for producing a plasma in the space between the target and the substrate and for energizing ions in the plasma to bombard the target to dislodge coating material therefrom for propagation onto the substrate;
a collimator interposed between the plasma and the substrate in the chamber, the collimator including a web structure physically occupying space between the target and the substrate, the web structure having openings therethrough and being dimensioned to restrict propagation paths of material sputtered from the target through the openings and onto the substrate;

gas distribution passages carried by the collimator in the space physically occupied by the web structure or otherwise out of the propagation paths of the sputtered material, the passages including outlets distributed across the collimator for discharging gas from the passages toward the substrate; and means for supplying processing gas to the passages.

7. The apparatus of claim 6 wherein:

the passages are formed within the web structure of the collimator.

8. The apparatus of claim 6 wherein:

the outlets are positioned and sized so as to affect the distribution of supplied processing gas over the surface of the substrate.

9. The apparatus of claim 8 wherein:

the substrate holding means and target supporting means are circular and aligned on a centerline thereof;

the web structure of the collimator includes at least one central vane extending approximately diametrically through a centerline; and the outlets include outlets distributed along the central vane near the centerline of the substrate.

10. The apparatus of claim 9 wherein:

the collimator includes two central mutually perpendicular vanes extending approximately diametrically through the centerline; and the outlets include outlets distributed along both central vanes near the centerline of the substrate.

11. A method of reactive sputter coating a film onto three dimensional features of a semiconductor wafer having a central area and an outer rim, the method comprising the steps of:

supporting a stepped semiconductor wafer in a vacuum sputter coating chamber;

supporting a sputtering target in the vacuum chamber with a sputtering surface thereof facing the wafer;

filling the chamber with a sputtering gas at a vacuum pressure level;

producing a plasma of the sputtering gas in the space between the target and the wafer and bombarding the target with ions from the plasma to sputter coating material therefrom for propagation onto the wafer;

disposing a collimator in the chamber between the plasma and the wafer, the collimator including a grid of vanes having a width extending in a direction from the target to the wafer to restrict propagation paths of the sputtered material onto the wafer; and supplying reactive gas through passages in the vanes and discharging the reactive gas from the passages in a region inward of the outer rim of the wafer.

12. The method of claim 11 wherein:

the reactive gas supplying step includes the step of discharging the reactive gas from the passages in the central area of the wafer.

13. The method of claim 11 wherein:

the reactive gas supplying step includes the step of discharging the reactive gas from the passages in a region of the central area of the wafer in a direction toward and generally perpendicular to the wafer.

14. The method of claim 11 for coating a titanium nitride film onto three dimensional features of a semiconductor wafer, wherein:

the target supporting step includes the step of supporting a titanium target in the chamber and the plasma producing step includes the step of producing the plasma and sputtering titanium material therefrom for propagation onto the wafer;

the reactive gas supplying step includes the step of discharging the nitrogen gas from the passages in a region of the central area of the wafer in a direction toward and generally perpendicular to the wafer; and reacting the nitrogen with the sputtered titanium on the surface of the wafer to produce a titanium nitride film thereon.

* * * * *